United States Patent
Reitz et al.

(10) Patent No.: US 11,719,759 B2
(45) Date of Patent: Aug. 8, 2023

(54) METHOD AND MEASURING DEVICE FOR DETECTING A LEAKAGE CURRENT IN AN UNGROUNDED, SINGLE-PHASE ALTERNATING-CURRENT POWER SUPPLY SYSTEM

(71) Applicant: Bender GmbH & Co. KG, Gruenberg (DE)

(72) Inventors: Julian Reitz, Gruenberg (DE); Eckhard Broeckmann, Giessen (DE); Dieter Hackl, Fernwald (DE); Karl Schepp, Reiskirchen (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 17/737,195

(22) Filed: May 5, 2022

(65) Prior Publication Data

US 2022/0357411 A1  Nov. 10, 2022

(30) Foreign Application Priority Data

May 6, 2021 (DE) ...................... 10 2021 111 858.1

(51) Int. Cl.
| | |
|---|---|
| *G01R 31/52* | (2020.01) |
| *G01R 27/26* | (2006.01) |
| *G01R 27/18* | (2006.01) |
| *G01R 31/00* | (2006.01) |

(52) U.S. Cl.
CPC .............. *G01R 31/52* (2020.01); *G01R 27/18* (2013.01); *G01R 27/2605* (2013.01); *G01R 27/26* (2013.01); *G01R 31/00* (2013.01)

(58) Field of Classification Search
CPC ........ G01R 27/00; G01R 27/02; G01R 27/16; G01R 27/18; G01R 27/26; G01R 27/2605; G01R 31/00; G01R 31/50; G01R 31/52

USPC ................ 324/500, 509, 512, 519, 522, 555
See application file for complete search history.

(56) References Cited

U.S. PATENT DOCUMENTS

| | | | |
|---|---|---|---|
| 8,559,142 B2 * | 10/2013 | Liu ..................... | G01R 31/1227 324/509 |
| 2015/0285850 A1 * | 10/2015 | Liu ..................... | G01R 27/025 324/551 |

FOREIGN PATENT DOCUMENTS

| | | | | |
|---|---|---|---|---|
| DE | 256925 A1 | 5/1988 | | |
| DE | 102015207456 B3 * | 9/2016 | ........... | G01R 31/086 |
| DE | 102018125004 B3 | 12/2019 | | |
| EP | 3524985 A1 * | 8/2019 | ........... | G01R 27/025 |
| EP | 3641087 A1 | 4/2020 | | |

(Continued)

*Primary Examiner* — Hoai-An D. Nguyen
(74) *Attorney, Agent, or Firm* — Dickinson Wright PLLC; Andrew D. Dorisio

(57) ABSTRACT

A method and a measuring device for detecting a leakage current in an ungrounded, single-phase alternating-current power supply system. A variable test resistance is switched between one of the outer conductors and ground and starting from a minimally admissible test-resistance value, at least one of three support test-resistance values is determined as support locations. In an equivalent circuit of the modeled alternating-current power supply system, an equations system is set up for describing the dependency of currents and voltages. An extrapolation on the test-resistance value zero leads to a calculated test current which corresponds to the leakage current to be detected. Consequently, a ground fault situation may be simulated without actually causing a dangerous ground fault.

7 Claims, 3 Drawing Sheets

(56) References Cited

FOREIGN PATENT DOCUMENTS

| JP | H06261442 | A | * | 9/1994 | ............. | G01R 19/00 |
| JP | 3673589 | B2 | * | 7/2005 | ............. | G01R 31/00 |
| KR | 101037729 | B1 | * | 5/2011 | ............. | G01R 27/18 |

* cited by examiner

State of the art

METHOD AND MEASURING DEVICE FOR DETECTING A LEAKAGE CURRENT IN AN UNGROUNDED, SINGLE-PHASE ALTERNATING-CURRENT POWER SUPPLY SYSTEM

This application claims priority to German Patent Application No. 10 2021 111 858.1 filed on May 6, 2021, the disclosure of which is incorporated herein by reference.

TECHNICAL FIELD

The invention relates to a method and a measuring device for detecting a leakage current in an ungrounded, single-phase alternating-current power supply system.

In the scope of commissioning tests and recurring tests in power supply systems and electric installations, certain execution standards are mandated and to be substantiated via measurements when it comes to electrical safety.

BACKGROUND

A measurement concerning specifically the ungrounded power supply system (French: Isolé Terre—IT network) consists in determining the leakage current. The purpose of this provision is to determine a maximally possible touch voltage which results from the product of the leakage current and the grounding resistance. According to standard DIN VDE 0100-410/IEC 60364-4-41:205, this voltage value has to be ≤50 V for alternating-current power supply systems.

From the state of the art, methods for detecting the leakage current are known according to DIN VDE 0100-600/IEC60364-6:2016. According thereto, the leakage current can be detected either via calculation using known parameters (leakage capacitance, insulation resistance) or via measurement. For this measurement, two methods are mentioned; a ground fault has to be switched between one of the outer conductors and ground (ground potential) for both methods. In this context, on the one hand, the current can be measured as a result of the ground fault consciously caused by current measuring equipment (current measuring device, ammeter). Alternatively, the touch voltage should be measured, the voltage being measured between the grounding point of the power supply system and a separate ground connection, for example a foundation earth electrode.

The more extensive an ungrounded power supply system is, however, the more intricate the calculation of the leakage current becomes as many influential factors will be unknown.

Moreover, the measurement also poses a danger to people as a second fault—other than the first fault caused by the current measuring device—must be precluded in an existing one-sided ground, and moreover high capacitive discharge currents can flow when executing the grounding procedure. Electric arcs can also occur as a result of an unsuitable contacting.

Besides the danger to persons, the ground faults specified in the standards also constantly run the risk of damaging the electric installation.

SUMMARY

The object of the invention is therefore to propose a method and a measuring device which enable measuring the leakage current in an ungrounded alternating-current power supply system without posing a threat to persons and without running the risk of damaging the electric installation.

In a first step, a variable test resistance is switched between one of the outer conductors and ground, a test-resistance value being supposed to be set infinitely.

With this step, the prerequisite of installing the variable test resistance in the alternating-current power supply system is created initially. The variable test resistance is initially set infinitely to a (maximal) test-resistance value and accordingly corresponds to an open-circuit operation at open clamps of the variable test resistance where an outer-conductor-to-ground voltage is available between the outer conductor and ground.

By means of line-voltage measuring equipment, an operating voltage of the alternating-current power supply system is measured subsequently between the outer conductors.

This measuring process is necessary should the precise operating voltage not be known.

By means of ground-voltage measuring equipment, an outer-conductor-to-ground voltage is subsequently measured between one of the outer conductors and ground.

This measurement can be executed at the still open clamps of the variable test resistance as an open-circuit-operation voltage measurement, the order in which the operating voltage and the outer-conductor-to-ground voltage is measured being exchangeable.

If the condition that the measured outer-conductor-to-ground voltage be greater than or equal to half the operating voltage is not fulfilled, the variable test resistance is switched between the other outer conductor and ground.

This ensures that the variable test resistance is input at the outer conductor having the highest outer-conductor-to-ground voltage, thus leading to a higher current which in turn leads to higher precision in subsequent numerical calculations due to the better signal-to-noise ratio.

A minimally admissible test-resistance value is determined for the variable test resistance.

This minimally admissible test-resistance value is defined such, for example, that triggering a residual current device is prevented and is 5 kΩ, for example.

Subsequently, at least three support test-resistance values are determined as support locations starting from the minimally admissible test-resistance value.

Suitable support test-resistance values are, for example, 5 kΩ (minimally admissible test-resistance value), 10 kΩ, 15 kΩ, 20 kΩ, 25 kΩ. While a large number of support test-resistance values increases the test duration, it also increases the disturbance resistance of the method.

After, the support test-resistance values are set and an accordingly resulting measured test current is measured via the variable test resistance by means of current measuring equipment.

The previously established support test-resistance values are gradually set, i.e., the variable test resistance having the corresponding support test-resistance value is applied, in order to be able to detect a functional metrological dependency between the set support test-resistance value and the measured test current resulting in the corresponding support test-resistance value.

The alternating-current power supply system is formed by an equivalent circuit having the test resistance and having leakage impedances, which comprise leakage capacitances of the alternating-current power supply system as a capacitive portion.

As a model of the alternating-current power supply system, the equivalent circuit reflects its electric behavior regarding the leakage current to be detected.

Based on this equivalent circuit, the leakage capacitances are determined from an equations system, which describes the equivalent circuit, by means of a numerical approximation method such that the deviation of a calculated test current from the measured test current is minimized to the support locations (support test-resistance values).

The alternating-current power supply system modeled in the equivalent circuit can be conveyed by means of Kirchhoff's first law and Kirchhoff's second law to an equations system which describes the dependency of currents and voltages, in particular the dependency of the test current flowing through the test resistance of the operating voltage.

The still unknown factors (impedances) of the equations system are replaced by typical values (ohmic portions), with the result that the leakage capacitances (capacitive portions), which are determined by a numerical approximation method, remain as relevant unknown parameters.

Finally, the leakage current is calculated as a calculated test current from the equations system using the detected leakage capacitances and using the test-resistance value zero.

This extrapolation on the test-resistance value zero leads to a calculated test current which corresponds to the leakage current to be detected. Consequently, a ground fault situation is simulated without actually causing a dangerous ground fault as only significant test-resistance values are applied. This leads to the advantage that electric installations for measuring leakage currents must no longer be switched off and the handler is no longer subject to the risk posed by electric shock or electric arcs which is connected to producing a ground fault.

This permits outputting the leakage current and the leakage capacitances.

The method according to the invention not only permits detecting the leakage current but also determining the leakage capacitance in a conductor-selective manner. Precise information on the electric state of the ungrounded power supply system is retrievable since the capacitance measuring range is in the single-digit nF to single-digit µF range with the method—in contrast to common insulation monitoring devices which commonly can only determine overall leakage capacitances ranging from a few µF.

In another embodiment of the method, the numerical approximation method is executed according to the method of least squares.

As an approximation method, the method of least-squares function approximation (LS) known from the state of the art is applied. For this purpose, the leakage capacitances are determined numerically in such a manner that the sum of the square deviation of the test current calculated using the approximation values is minimized to the support test-resistance values using the measured test current.

Furthermore, ohmic portions of the leakage impedances are neglected in the equivalent circuit in the sense of an infinitely large resistance value.

For the ohmic portions (insulation resistances) of the leakage impedances, assumptions advantageously are made. The insulation resistances can be observed in good approximation as open-circuit operation as the leakage current is to only be measured in an ungrounded power supply system having intact insulation, e.g., insulation-resistance values of ≥1 MΩ.

The coupling resistances of an insulation monitoring device (IMD) are set to values common in practice or provided by precise values when known.

Advantageously, the method sequence is executed automatically by a computing unit.

For this purpose, the method can be automated cyclically in a correspondingly configured computing unit and be executed remotely, which means savings in costs for the installation operator and increases user-friendliness and operational safety.

For this purpose, the measuring device has a variable test resistance which can be switched to one of the outer conductors and ground.

The variable test resistance is connected to one of the outer conductors according to the measurement of the operational voltage.

The measuring device comprises line-voltage measuring equipment for measuring an operating voltage of the alternating-current power supply system between the outer conductors, and ground-voltage measuring equipment for measuring an outer-conductor-to-ground voltage between one of the outer conductors and ground, and a current measuring device for measuring a settable, measured test current via the variable test resistance.

The measuring device further has a computing unit which is configured for controlling and executing the method sequence. The computing unit is preferably realized as a microprocessor.

In another embodiment of the measuring device, the variable test resistance, the ground-voltage measuring equipment, the current measuring device and the computing device are realized as a structural unit.

This structural unit can also be realized by integrating the line-voltage measuring equipment to form an enhanced structural unit.

Furthermore, the variable test resistance is executed as a resistance measurement value having discretely switchable resistance values or as an electronic resistance having semiconductor structural elements.

The claimed structural features of the measuring device according to the invention execute the corresponding method steps of the method according to the invention. Consequently, the advantages pertaining to the method apply to the measuring device to the same extent.

BRIEF DESCRIPTION OF THE DRAWINGS

Further advantageous embodiment features are derived from the following description and drawings which describe an embodiment of the invention by means of examples.

DETAILED DESCRIPTION

Figure 1:
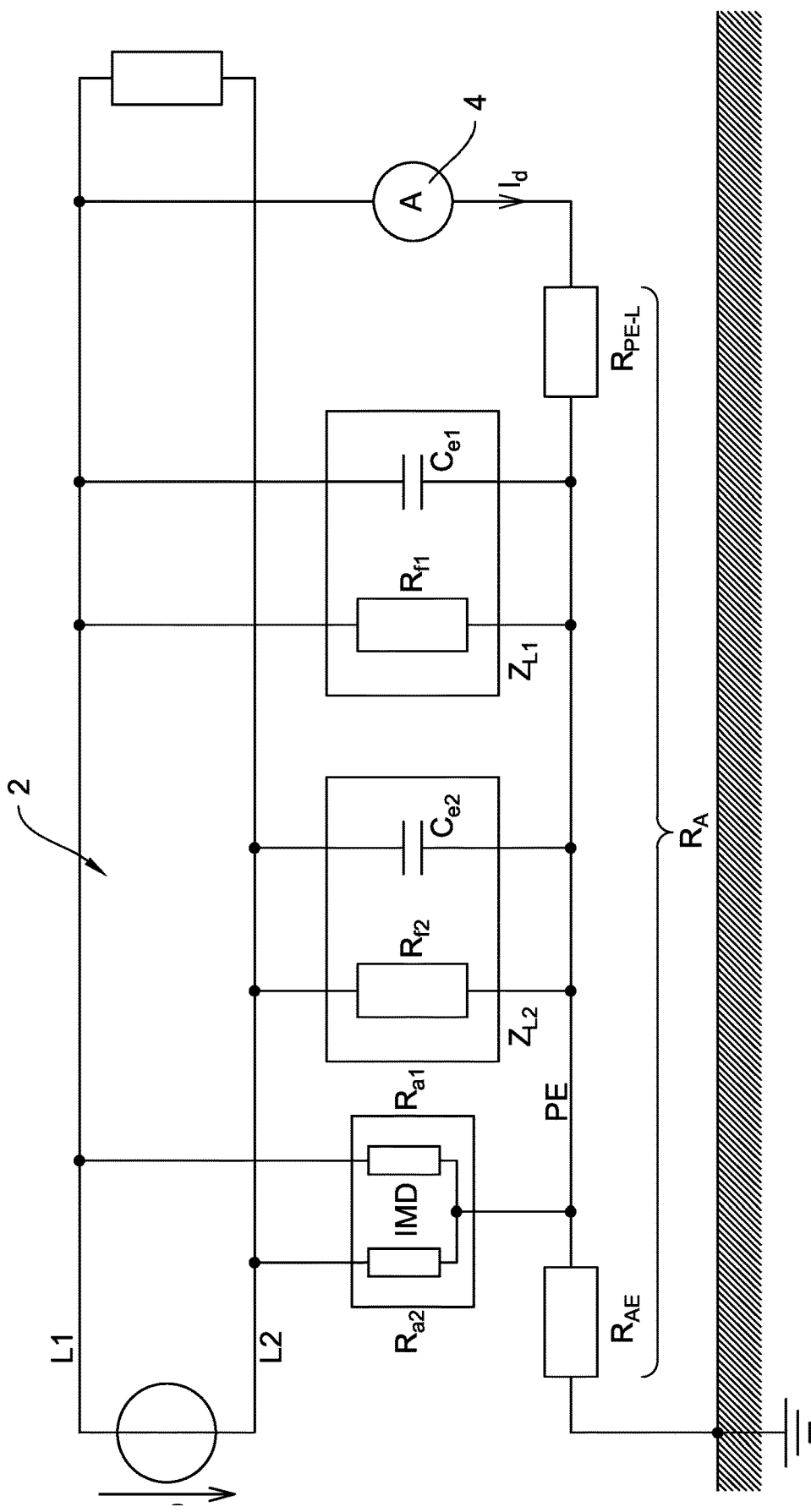
FIG. 1 shows a leakage-current measurement according to the state of the art.

In a functional circuit diagram, FIG. 1 shows a method known from the state of the art for measuring leakage current $I_d$ in a single-phase alternating-current power supply system 2 having outer conductors L1, L1 and an operational voltage $U_0$.

Per definition, all active parts of ungrounded power supply system 2 are separate from ground PE; however, ungrounded alternating-current power supply system 2 comprises unpreventable leakage impedances $Z_{L1}$, $Z_{L2}$ of outer conductors L1, L2 with respect to ground PE. Leakage impedances $Z_{L1}$, $Z_{L2}$ are made up of an ohmic portion $R_{f1}$, $R_{f2}$ (insulation resistance) and a capacitive portion $C_{e1}$, $C_{e2}$ (leakage capacitances). A grounding resistance $R_A$ consists of the sum of the resistances of ground electrode $R_{AE}$ and ground conductor $R_{PE-L}$.

For insulation monitoring as mandated by standards, an insulation monitoring device IMD having coupling resistances $R_{a1}$, $R_{a2}$ is switched between each one of outer conductors L1, L2 and ground PE.

According to the state of the art, leakage current $I_d$ is measured by an ammeter 4 having inner resistance zero being switched between outer conductor L1 and ground PE. However, the thus consciously caused ground fault poses a risk to the handler and to the electric installation because a possible second fault (ground fault at the other outer conductor L2) could be the cause for high capacitive discharge current to flow or electric arcs to arise.

Figure 2:
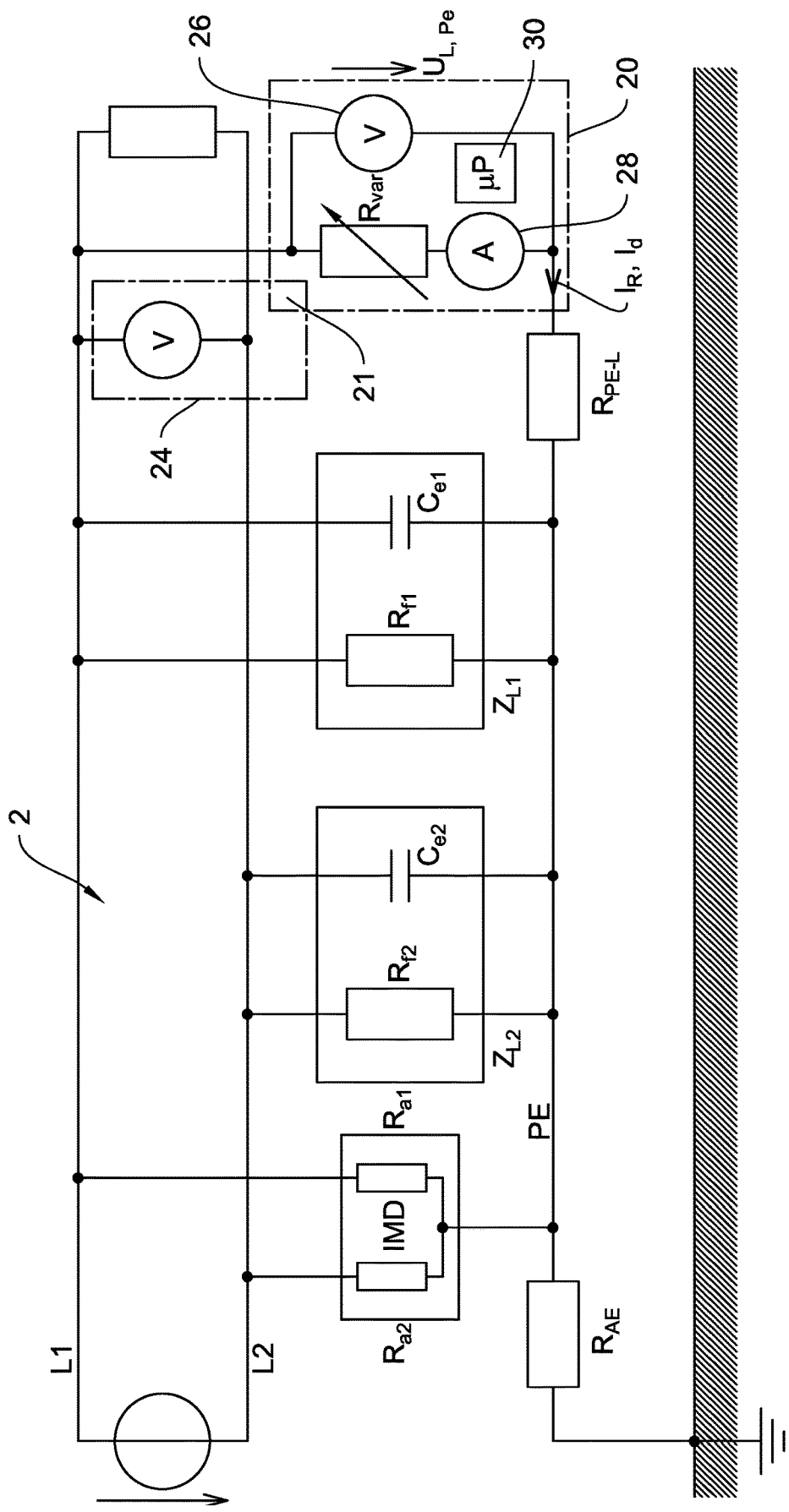
FIG. 2 shows a measuring device according to the invention for detecting a leakage current.

FIG. 2 illustrates a measuring device 20, 21 according to the invention for detecting leakage current $I_d$ in an ungrounded, single-phase alternating-current power supply system 2.

Measuring device 20, 21 according to the invention comprises a variable test resistance $R_{var}$ which is switched between one of outer conductors L1, L2—outer conductor L1 presently. In the following, the designation $R_{var}$ is used both for the electric resistance as a physical object (test resistance) and for the (continuous) physical factor (test-resistance value) assigned to this test resistance.

Measuring device 20, 21 according to the invention further comprises current measuring equipment 28 by means of which a measured test current $I_R$ settable for a pre-specified test-resistance value $R_{var}$ is registered via variable test resistance $R_{var}$.

Ground-voltage measuring equipment 26 of measuring device 20, 21 according to the invention measures an outer-conductor-to-ground voltage $U_{L,Pe}$ between outer conductor L1 and ground PE, it holding true for outer conductor L1 that $U_{L,Pe} \geq U_0/2$.

A computing unit 30 of measuring device 20, 21 according to the invention is configured for controlling the method sequence and for executing the calculations and can comprise a remote control.

Variable test resistance $R_{var}$, ground-voltage measuring equipment 26, current measuring equipment 28 and computing unit 30 can be realized as a structural unit 20.

Line-voltage measuring equipment 24 serves for measuring an operational voltage $U_0$ of alternating-current power supply system 2 between outer conductors L1, L2.

Line-voltage measuring equipment 24 can be integrated with variable test resistance $R_{var}$, ground-voltage measuring equipment 26, current measuring equipment 28 and computing unit 30 to form an enhanced structural unit (21).

Figure 3:
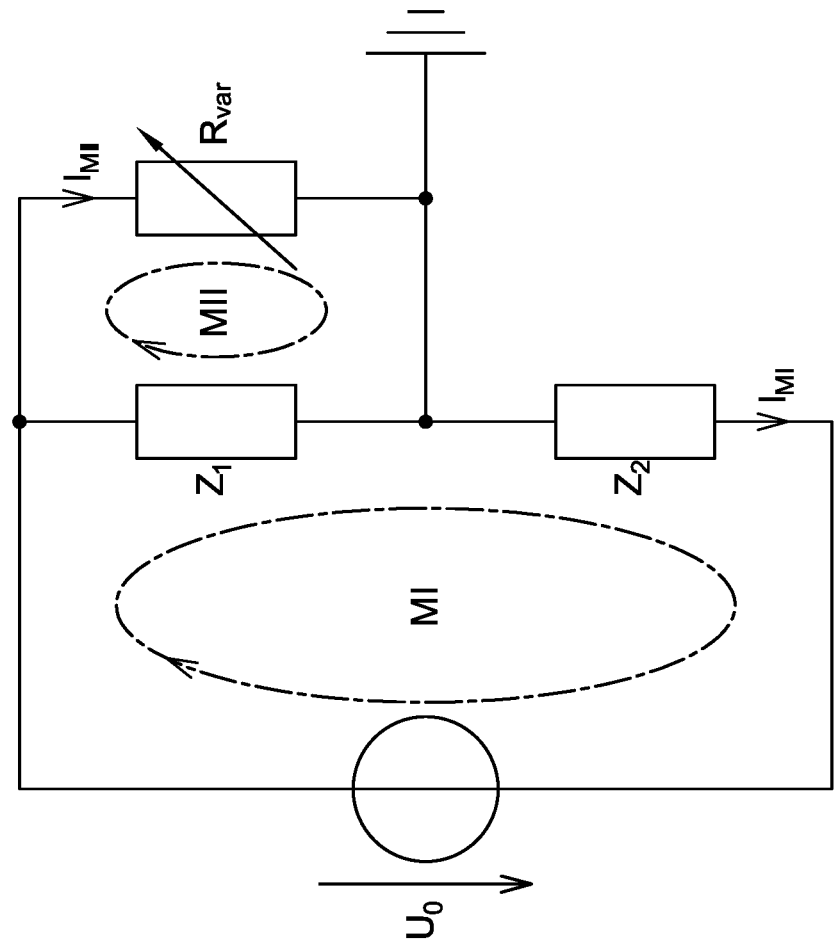
FIG. 3 shows an equivalent circuit for detecting the leakage current.

FIG. 3 shows an equivalent circuit for detecting leakage current $I_d$. For this purpose, alternating-current power supply system 2 is modelled in an impedance network having overall impedances $Z_1$, $Z_2$ and variable test resistance $R_{var}$ and operating voltage $U_0$.

Overall impedances $Z_1$ and $Z_2$ summarize the individual electric components between outer conductors L1, L2 and ground PE to each overall impedance $Z_1$, $Z_2$ according to equation (1).

$$\begin{bmatrix} Z_1 \\ Z_2 \end{bmatrix} = \begin{bmatrix} R_{a1} \| R_{f1} \| X_{Ce1} \\ R_{a2} \| R_{f2} \| X_{Ce2} \end{bmatrix} \quad (1)$$

Overall impedance $Z_1$ therefore results from the parallel circuit of ohmic resistance $R_{a1}$ (coupling resistance of insulation monitoring device IMD) and leakage impedance $Z_{L1}$ which consists of ohmic portion $R_{f1}$ (insulation resistance) and reactance $X_{Ce1}$ (according to leakage capacitance $C_{e1}$). The same applies to overall impedance $Z_2$ accordingly.

From Kirchhoff's second law MI, MII and Kirchhoff's first law, the equations system is yielded from the equivalent circuit diagram according to equation (2).

$$\begin{bmatrix} Z_1 + Z_2 & -Z_1 \\ -Z_1 & Z_1 + R_{var} \end{bmatrix} \cdot \begin{bmatrix} I_{MI} \\ I_{MII} \end{bmatrix} = \begin{bmatrix} U_0 \\ 0 \end{bmatrix} \quad (2)$$

with $$I_R = I_{MII} \quad (3)$$

The equations system describes the analytic correlation between measured test current $I_R$ as a function of variable test-resistance value $R_{var}$.

From the measurements, accordingly set, measured test currents $I_{Ri}$ are known for known support test-resistance values $R_{var,i}$.

Hence, an equivalent circuit diagram model of the measuring order is available—parameters $R_{a1}$, $R_{a2}$, $R_{f1}$, $R_{f2}$, $X_{Ce1}$, $X_{Ce2}$, however, are unknown at first (gray box model). For this reason, assumptions are made for ohmic portions $R_{a1}$, $R_{a2}$, $R_{f1}$, $R_{f2}$. Insulation resistances $R_{f1}$ and $R_{f2}$ are assumed to be infinite because of the prerequisite of an intact insulation. Coupling resistances $R_{a1}$, $R_{a2}$ of insulation monitoring device IMD can be set to common values in practice or be implemented as precise values when known. Consequently, leakage capacitances $C_{e1}$ and $C_{e2}$ as unknown variables are significantly relevant parameters for measured test current $I_R$.

By means of a numerical approximation method, leakage capacitances $C_{e1}$ and $C_{e2}$ are determined such that the deviation of a calculated approximated test current $I_{R,fit}$, $I_{Ri,fit}$ from measured test current $I_{Ri}$ is minimized to support test-resistance values $R_{var,i}$ (support locations) in support points $I_{Ri}$ ($R_{var,i}$).

This becomes possible by applying the method least-squares function approximation according to equation (4).

$$\sum_{i=1}^{n} \left( \frac{I_{Ri}(R_{var,i}) - I_{Ri,fit}(R_{var,i}, C_{e1}, C_{e2})}{I_{Ri,fit}(R_{var,i}, C_{e1}, C_{e2})} \right)^2 \to \min \quad (4)$$

Using thus detected leakage capacitances $C_{e1}$, $C_{e2}$, leakage current $I_d$ can now be determined using equations (2), (3) and $I_R = I_d$ as calculated test current $I_{R0,fit}$, and the zero setting of test-resistance value $R_{var}$ can be determined.

The invention claimed is:

1. A method for detecting a leakage current ($I_d$) in an ungrounded, single-phase alternating-current power supply system (2) having two outer conductors (L1, L2), the method comprising the following steps:
    a) switching a variable test resistance ($R_{var}$) between one of the outer conductors (L1, L2) and ground (PE), a test-resistance value being supposed to be set infinitely,
    b) measuring an operating voltage ($U_0$) of the alternating-current power supply system (2) between the outer conductors (L1, L2) by means of line-voltage measuring equipment (24),
    c) measuring an outer-conductor-to-ground voltage ($U_{L,Pe}$) between one of the outer conductors (L1, L2) and ground (PE) by means of ground-voltage measuring equipment (26), d) should the condition that the outer-conductor-to-ground voltage ($U_{L,Pe}$) be greater than or equal to half the operating voltage ($U_0$) not be fulfilled, switching the variable test resistance ($R_{var}$) between the other outer conductor (L1, L2) and ground (PE), e) determining a minimally admissible test-resistance value ($R_{var,min}$) for the variable test resistance ($R_{var}$), f) determining at least three support test-resistance values ($R_{var,i}$) as support locations starting from the minimally admissible test-resistance value ($R_{var,min}$), g) setting the support test-resistance value ($R_{var,i}$) and measuring a correspondingly resulting, measured test current ($I_R$, $I_{Ri}$) via the variable test resistance ($R_{var}$) by means of current measuring equipment (28) for detecting a functional metrological dependency of the measured test current ($I_{Ri}$) of the support test-resistance value ($R_{var,i}$), h) mapping the alternating-current power supply system (2) via an equivalent circuit having the test resistance ($R_{var}$) and having leakage impedances ($Z_{L1}$, $Z_{L2}$) which have a capacitive portion of leakage capacitances ($C_{e1}$, $C_{e2}$) of the alternating-current power supply system (2), i) determining the leakage capacitances ($C_{e1}$, $C_{e2}$) from an equations system, which describes the equivalent circuit, by means of a numerical approximation method such that the deviation of a calculated test current ($I_{R,fit}$, $I_{Ri,fit}$) from the measured test current ($I_{Ri}$) is minimized to the support test-resistance values ($R_{var,i}$), j) calculating the leakage current ($I_d$) as a calculated test current ($I_{R,fit}$, $I_{R0,fit}$) from the equations system having the detected leakage capacitances ($C_{e1}$, $C_{e2}$) and having the rest-resistance value ($R_{var}$, $R_0$) zero, k) outputting the leakage current ($I_d$) and the leakage capacitances ($C_{e1}$, $C_{e2}$).

2. The method according to claim 1, wherein the numerical approximation method is executed according to the least-squares function approximation.

3. The method according to claim 1, wherein ohmic portions ($R_{f1}$, $R_{f2}$) of the leakage impedances ($Z_{L1}$, $Z_{L2}$) are neglected in the equivalent circuit in the sense of an infinitely large resistance value.

4. The method according to claim 1, wherein the method sequence is executed automatically by a computing unit (30).

5. A measuring device (20, 21) for detecting a leakage current ($I_d$) in an ungrounded, single-phase alternating-current power supply system (2) having two outer conductors (L1, L2), comprising:

a variable test resistance ($R_{var}$) which is switched to one of the outer conductors (L1, L2) and ground (PE), line-voltage measuring equipment (24) for measuring an operating voltage ($U_0$) of the alternating-current power supply system (2) between the outer conductors (L1, L2), ground-voltage measuring equipment (26) for measuring an outer-conductor-to-ground voltage ($U_{L,Pe}$) between one of the outer conductor (L1, L2) and ground (PE), a current measuring device (28) for measuring a settable, measured test current ($I_R$, $I_{Ri}$) via the variable test resistance ($R_{var}$), and having a computing unit (30) which is configured for controlling and executing the method sequence claimed in claim 1.

6. The measuring device (20, 21) according to claim 5, wherein the variable test resistance ($R_{var}$), the ground-voltage measuring equipment (26), the current measuring equipment (28) and the computing unit (30) are realized as a structural unit (20), or in that the variable test resistance ($R_{var}$), the ground-voltage measuring equipment (26), the current measuring equipment (28), the computing unit (30) and the line-voltage measuring equipment (24) are realized as an enhanced structural unit (21).

7. The measuring device (20, 21) according to claim 5, wherein the variable test resistance ($R_{var}$) is configured as a resistance network having discretely switchable resistance values or as an electronic resistance having semiconductor structural elements.

* * * * *